(12) United States Patent
Fan

(10) Patent No.: US 10,153,391 B2
(45) Date of Patent: Dec. 11, 2018

(54) GRAPHENE DISPLAY

(71) Applicant: Shenzhen China Star Optoelectronics Technology Co., Ltd., Shenzhen, Guangdong (CN)

(72) Inventor: Yong Fan, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 84 days.

(21) Appl. No.: 15/038,609

(22) PCT Filed: Apr. 25, 2016

(86) PCT No.: PCT/CN2016/080152
§ 371 (c)(1),
(2) Date: May 23, 2016

(87) PCT Pub. No.: WO2017/173680
PCT Pub. Date: Oct. 12, 2017

(65) Prior Publication Data
US 2018/0083157 A1    Mar. 22, 2018

(30) Foreign Application Priority Data

Apr. 6, 2016 (CN) .......................... 2016 1 0210822

(51) Int. Cl.
| | | |
|---|---|---|
| *H01L 29/06* | (2006.01) | |
| *H01L 29/08* | (2006.01) | |
| *H01L 33/00* | (2010.01) | |
| *H01L 27/15* | (2006.01) | |
| *H01L 33/26* | (2010.01) | |
| *H01L 33/40* | (2010.01) | |
| *H01L 33/42* | (2010.01) | |
| *H01L 33/48* | (2010.01) | |
| *H01L 33/58* | (2010.01) | |

(52) U.S. Cl.
CPC .......... *H01L 33/0041* (2013.01); *H01L 27/15* (2013.01); *H01L 27/156* (2013.01); *H01L 33/26* (2013.01); *H01L 33/405* (2013.01); *H01L 33/42* (2013.01); *H01L 33/483* (2013.01); *H01L 33/58* (2013.01)

(58) Field of Classification Search
CPC ... H01L 27/156; H01L 33/0041; H01L 33/26; H01L 33/405; H01L 33/42; H01L 33/483; H01L 33/58
See application file for complete search history.

(56) References Cited

U.S. PATENT DOCUMENTS

| | | |
|---|---|---|
| 2007/0170848 A1 | 7/2007 | Wu |
| 2015/0243849 A1 | 8/2015 | Stroetmann |
| 2017/0256679 A1 | 9/2017 | Fan |

FOREIGN PATENT DOCUMENTS

| | | |
|---|---|---|
| CN | 101866818 A | 10/2010 |
| CN | 102902121 A | 1/2013 |
| JP | 2005099314 A | 4/2005 |

*Primary Examiner* — Meiya Li
(74) *Attorney, Agent, or Firm* — Andrew C. Cheng

(57) ABSTRACT

A graphene display is provided. The graphene display includes a first graphene light-emitting unit and a second graphene light-emitting unit which are stacked and overlapped, and a metal shield layer disposed between the first graphene light-emitting unit and the second graphene light-emitting unit. The graphene display is simple in structure, and the colors of the emitted light at the two sides will not change because of the electric field of the gate electrode pattern so as to have more stable color and color reproduction.

9 Claims, 1 Drawing Sheet

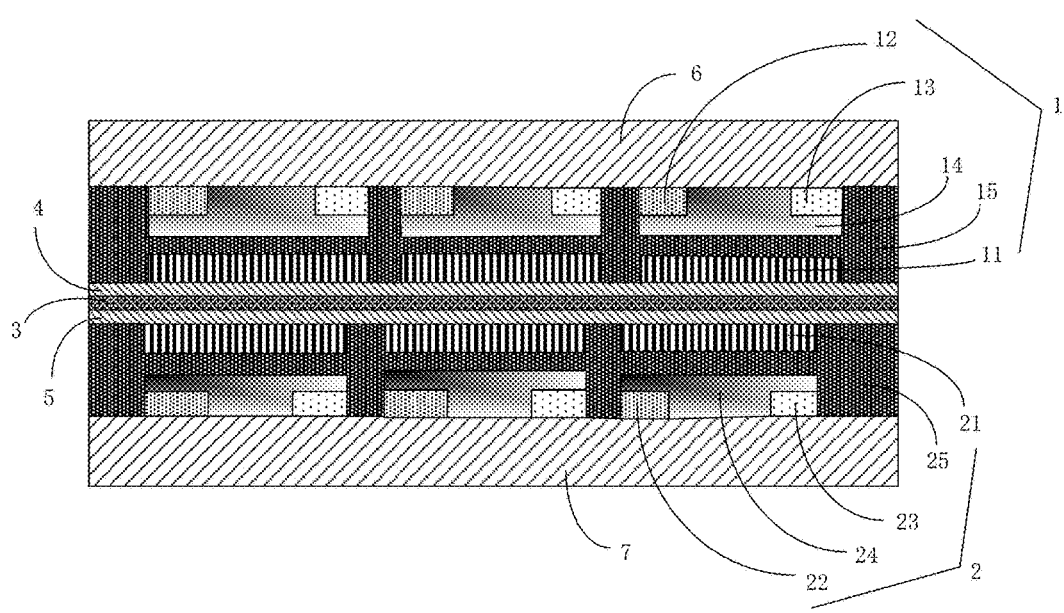

GRAPHENE DISPLAY

BACKGROUND OF THE INVENTION

1. Field of the Invention

The present invention relates to a display technology field, and more particularly to a graphene display.

2. Description of Related Art

A graphene material has excellent features of hard texture, high transparency (transmittance≈97.7%), high thermal conductivity (5300 W/m·K), and high electron mobility (over 15000 cm$^2$/V·s) such that the graphene material is gradually increased in display applications. Especially, in touch display application (replacing the conventional transparent conductive thin film of indium tin oxide (ITO)) and a light-emitting diode (LED) application. Recently, because of the graphene light-emitting element such as the graphene diode, the application of the graphene in display field can be expanded. The graphene diode can change the color of the emitted light through adjusting the voltage of the gate electrode. The principle is that the magnitude of the electric field generated by the gate electrode field can adjust the fermi level of the semiconductor graphene oxide in order to adjust the wavelength of the emitted light of the graphene. Currently, how to make the graphene display to have more stable color and color reproduction has become a hot topic of nowadays research.

SUMMARY OF THE INVENTION

The technology solution mainly solved by the present invention is to provide a graphene display such that the graphene display can have more stable color and color reproduction.

In order to solve the above technology problem, a technology solution adopted by the present invention is: a graphene display comprising: a first graphene light-emitting unit and a second graphene light-emitting unit which are stacked and overlapped; and a metal shield layer disposed between the first graphene light-emitting unit and the second graphene light-emitting unit.

Wherein, the first graphene light-emitting unit includes a first gate electrode pattern, the second graphene light-emitting unit includes a second gate electrode pattern overlapped with the first gate electrode pattern, wherein, the metal shield layer is located between the first gate electrode pattern and the second gate electrode pattern.

Wherein, the graphene display further includes a first insulation layer for electrically isolating the first gate electrode pattern from the metal shield layer, and a second insulation layer for electrically isolating the second gate electrode pattern from the metal shield layer.

Wherein, the graphene display further includes a first transparent substrate and a second transparent substrate which are disposed oppositely, wherein, the first graphene light-emitting unit and the second graphene light-emitting unit are disposed in overlapping between the first transparent substrate and the second transparent substrate, and a light-emitting surface of the first graphene light-emitting unit is disposed adjacent to the first transparent substrate, and a light-emitting surface of the second graphene light-emitting unit is disposed adjacent to the second transparent substrate.

Wherein, the first graphene light-emitting unit includes a first source electrode pattern and a first drain electrode pattern which are disposed on the first transparent substrate and disposed separately with each other, a first graphene light-emitting pattern electrically connected with the first source electrode pattern and the first drain electrode pattern and located between the first source electrode pattern and the first drain electrode pattern, a third insulation layer covering on the first graphene light-emitting pattern, wherein the first gate electrode pattern is disposed at a side of the third insulation layer away from the first transparent substrate; and the second graphene light-emitting unit includes a second source electrode pattern and a second drain electrode pattern which are disposed on the second transparent substrate and disposed separately with each other, a second graphene light-emitting pattern electrically connected with the second source electrode pattern and the second drain electrode pattern and located between the second source electrode pattern and the second drain electrode pattern, a fourth insulation layer covering on the second graphene light-emitting pattern, wherein the second gate electrode pattern is disposed at a side of the fourth insulation layer away from the second transparent substrate.

Wherein, third insulation layer further electrically isolates the first graphene light-emitting unit adjacent to the third insulation layer, and the fourth insulation layer further electrically isolates the second graphene light-emitting unit adjacent to the fourth insulation layer.

Wherein, the first graphene light-emitting unit is fixed on the first transparent substrate, the second graphene light-emitting unit is fixed on the second transparent substrate, and the first graphene light-emitting unit and the second graphene light-emitting unit are fixed at two sides of the metal shield layer through a symmetrical manner.

Wherein, the material of each of the first transparent and the second transparent substrate is a transparent organic material, glass or nickel which is water blocking, oxygen blocking, water isolated and oxygen isolated.

Wherein, the material of each of the first graphene light-emitting pattern and the second graphene light-emitting pattern is reduced graphene oxide of a semiconductor.

Wherein, the material of each of the first source electrode pattern, the second source electrode pattern, the first drain electrode pattern and the second drain electrode pattern is a reduced graphene oxide; the material of each of the first gate electrode pattern and the second gate electrode pattern is a graphene oxide or a high reflectivity metal.

The beneficial effects of the present invention is: comparing with the conventional art, the graphene display is simple in structure through disposing the first graphene light-emitting unit and the second graphene light-emitting unit having capable of displaying at two sides, the colors of the emitted light at the two sides will not change because of the electric field of the gate electrode pattern so as to have more stable color and color reproduction.

BRIEF DESCRIPTION OF THE DRAWINGS

FIG. 1 is a schematic diagram of a graphene display of the present invention.

DETAILED DESCRIPTION OF THE PREFERRED EMBODIMENT

With reference to FIG. 1, and FIG. 1 is a schematic diagram of a graphene display of the present invention. The graphene display includes a first graphene light-emitting unit 1 and a second graphene light-emitting unit 2 which are stacked and overlapped, and a metal shield layer 3 disposed between the first graphene light-emitting unit 1 and the second graphene light-emitting unit 2.

The first graphene light-emitting unit 1 includes a first gate electrode pattern 11, the second graphene light-emitting unit 2 includes a second gate electrode pattern 21 overlapped with the first gate electrode pattern 11. Wherein, the metal shield layer 3 is located between the first gate electrode pattern 11 and the second gate electrode pattern 21.

The graphene display further includes a first insulation layer 4 for electrically isolating the first gate electrode pattern 11 from the metal shield layer 3, and a second insulation layer 5 for electrically isolating the second gate electrode pattern 21 from the metal shield layer 3.

The graphene display further includes a first transparent substrate 6 and a second transparent substrate 7 which are disposed oppositely. Wherein, the first graphene light-emitting unit 1 and the second graphene light-emitting unit 2 are disposed in overlapping between the first transparent substrate 6 and the second transparent substrate 7, and a light-emitting surface of the first graphene light-emitting unit 1 is disposed adjacent to the first transparent substrate 6, and a light-emitting surface of the second graphene light-emitting unit 2 is disposed adjacent to the second transparent substrate 7.

The first graphene light-emitting unit 1 includes a first source electrode pattern 12 and a first drain electrode pattern 13 which are disposed on the first transparent substrate 6 and disposed separately with each other, a first graphene light-emitting pattern 14 electrically connected with the first source electrode pattern 12 and the first drain electrode pattern 13 and located between the first source electrode pattern 12 and the first drain electrode pattern 13, a third insulation layer 15 covering on the first graphene light-emitting pattern 14. The first gate electrode pattern 11 is disposed at a side of the third insulation layer 15 away from the first transparent substrate 6.

The second graphene light-emitting unit 2 includes a second source electrode pattern 22 and a second drain electrode pattern 23 which are disposed on the second transparent substrate 7 and disposed separately with each other, a second graphene light-emitting pattern 24 electrically connected with the second source electrode pattern 22 and the second drain electrode pattern 23 and located between the second source electrode pattern 22 and the second drain electrode pattern 23, a fourth insulation layer 25 covering on the second graphene light-emitting pattern 24. The second gate electrode pattern 21 is disposed at a side of the fourth insulation layer 25 away from the second transparent substrate 7.

The third insulation layer 15 further electrically isolates the first graphene light-emitting unit 1 adjacent to the third insulation layer 15, and the fourth insulation layer 25 further electrically isolates the second graphene light-emitting unit 2 adjacent to the fourth insulation layer 25.

The first graphene light-emitting unit 1 is fixed on the first transparent substrate 6, and the second graphene light-emitting unit 2 is fixed on the second transparent substrate 7, and the first graphene light-emitting unit 1 and the second graphene light-emitting unit 2 are fixed at two sides of the metal shield layer 3 through a symmetrical manner.

In the present embodiment, the number of the first graphene light-emitting unit 1 and the second graphene light-emitting unit 2 can be disposed according to a specific requirement of the graphene display. The material of each of the first transparent 6 and the second transparent substrate 7 is a transparent organic material, glass or nickel which is water blocking, oxygen blocking, water isolated and oxygen isolated. The material of each of the first graphene light-emitting pattern 14 and the second graphene light-emitting pattern 24 is reduced graphene oxide of a semiconductor (semiconductor graphene oxide). The material of each of the first source electrode pattern 12, the second source electrode pattern 22, the first drain electrode pattern 13 and the second drain electrode pattern 23 is a reduced graphene oxide. The material of each of the first gate electrode pattern 11 and the second gate electrode pattern 21 is a graphene oxide or a high reflectivity metal.

For a graphene display, the first graphene light-emitting unit 1 and the second graphene light-emitting unit 2 will emit light having different colors according to different voltages of the gate electrode pattern. For example, when the voltage Vgs of the gate electrode pattern is in a range of 0-10 volts and the voltage Vds between the drain electrode pattern and the source electrode pattern is greater than a turn-on voltage Vth, the light emitted from the first graphene light-emitting unit 1 and the second graphene light-emitting unit 2 is a red light. When the voltage Vgs is in a range of 20-30 volts and the voltage Vds between the drain electrode pattern and the source electrode pattern is greater than a turn-on voltage Vth, the light emitted from the first graphene light-emitting unit 1 and the second graphene light-emitting unit 2 is a green light. When the voltage Vgs is in a range of 40-50 volts and the voltage Vds between the drain electrode pattern and the source electrode pattern is greater than a turn-on voltage Vth, the light emitted from the first graphene light-emitting unit 1 and the second graphene light-emitting unit 2 is a blue light. Besides, through changing the magnitude of the voltage Vds, the light intensity emitted from the first graphene light-emitting unit 1 and the second graphene light-emitting unit 2 can be changed in order to adjust a grayscale. According to the difference of the voltages of the first gate electrode pattern 11 and the second gate electrode pattern 21, the first graphene light-emitting unit 1 and the second graphene light-emitting unit 2 can be divided into three types of RGB pixels, and the RGB pixels are separated by an insulation layer made of $SiO_2$.

In order to avoid affecting the color of the emitted light of two display surfaces of the graphene display because of the change of the gate electrode field, between the first gate electrode pattern 11 and the second gate electrode pattern 21 of the graphene display, a metal shield layer 3 is added. In order to avoid generating a current leakage among the metal shield layer 3, the first gate electrode pattern 11 and the second gate electrode pattern 21, a first insulation layer is provided between the first gate electrode pattern 11 and the metal shield layer 3, and the second insulation layer is provided between the second electrode pattern 21 and the metal shield layer 3.

The graphene display is simple in structure through disposing the first graphene light-emitting unit and the second graphene light-emitting unit having capable of displaying at two sides, the colors of the emitted light at the two sides will not change because of the electric field of the gate electrode pattern so as to have more stable color and color reproduction.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A graphene display comprising:
a first graphene light-emitting unit and a second graphene light-emitting unit which are stacked and overlapped; and
a metal shield layer disposed between the first graphene light-emitting unit and the second graphene light-emitting unit.

2. The graphene display according to claim 1, wherein, the first graphene light-emitting unit includes a first gate electrode pattern, the second graphene light-emitting unit includes a second gate electrode pattern overlapped with the first gate electrode pattern, wherein, the metal shield layer is located between the first gate electrode pattern and the second gate electrode pattern.

3. The graphene display according to claim 2, wherein, the graphene display further includes a first insulation layer between the first gate electrode pattern and the metal shield layer, and a second insulation layer between the second gate electrode pattern and the metal shield layer.

4. The graphene display according to claim 3, wherein, the graphene display further includes a first transparent substrate and a second transparent substrate which are disposed oppositely, wherein, the first graphene light-emitting unit and the second graphene light-emitting unit are disposed in overlapping between the first transparent substrate and the second transparent substrate, and a light-emitting surface of the first graphene light-emitting unit is disposed adjacent to the first transparent substrate, and a light-emitting surface of the second graphene light-emitting unit is disposed adjacent to the second transparent substrate.

5. The graphene display according to claim 4, wherein, the first graphene light-emitting unit includes a first source electrode pattern and a first drain electrode pattern which are disposed on the first transparent substrate and disposed separately with each other, a first graphene light-emitting pattern electrically connected with the first source electrode pattern and the first drain electrode pattern and located between the first source electrode pattern and the first drain electrode pattern, a third insulation layer covering on the first graphene light-emitting pattern, wherein the first gate electrode pattern is disposed at a side of the third insulation layer away from the first transparent substrate; and
the second graphene light-emitting unit includes a second source electrode pattern and a second drain electrode pattern which are disposed on the second transparent substrate and disposed separately with each other, a second graphene light-emitting pattern electrically connected with the second source electrode pattern and the second drain electrode pattern and located between the second source electrode pattern and the second drain electrode pattern, a fourth insulation layer covering on the second graphene light-emitting pattern, wherein the second gate electrode pattern is disposed at a side of the fourth insulation layer away from the second transparent substrate.

6. The graphene display according to claim 5, wherein, a material of each of the first graphene light-emitting pattern and the second graphene light-emitting pattern is reduced graphene oxide of a semiconductor.

7. The graphene display according to claim 5, wherein, a material of each of the first source electrode pattern, the second source electrode pattern, the first drain electrode pattern and the second drain electrode pattern is a reduced graphene oxide; a material of each of the first gate electrode pattern and the second gate electrode pattern is a graphene oxide or a high reflectivity metal.

8. The graphene display according to claim 4, wherein, the first graphene light-emitting unit is fixed on the first transparent substrate, and the second graphene light-emitting unit is fixed on the second transparent substrate, and wherein the first transparent substrate on which the first graphene light-emitting unit is fixed and the second transparent substrate on which the second graphene light-emitting unit is fixed are arranged at two sides of the metal shield layer in a symmetrical manner.

9. The graphene display according to claim 4, wherein, a material of each of the first transparent substrate and the second transparent substrate is a transparent organic material, glass or nickel which is water blocking, oxygen blocking, water isolated and oxygen isolated.

* * * * *